United States Patent
Lee et al.

(10) Patent No.: US 8,642,881 B2
(45) Date of Patent: Feb. 4, 2014

(54) THIN FILM SOLAR CELL AND METHOD OF MANUFACTURING THE SAME

(75) Inventors: Sungeun Lee, Seoul (KR); Jinhyung Ahn, Seoul (KR); Jeonghun Son, Seoul (KR)

(73) Assignee: LG Electronics Inc., Seoul (KR)

( * ) Notice: Subject to any disclaimer, the term of this patent is extended or adjusted under 35 U.S.C. 154(b) by 206 days.

(21) Appl. No.: 13/176,662

(22) Filed: Jul. 5, 2011

(65) Prior Publication Data

US 2011/0259392 A1     Oct. 27, 2011

(30) Foreign Application Priority Data

Nov. 4, 2010   (KR) .................. 10-2010-0109096

(51) Int. Cl.
   *H01L 31/00*    (2006.01)
(52) U.S. Cl.
   USPC ............... 136/252; 438/62; 438/66; 438/98; 438/95

(58) Field of Classification Search
   USPC .......................................................... 136/244
   See application file for complete search history.

(56) References Cited

U.S. PATENT DOCUMENTS

| | | | |
|---|---|---|---|
| 5,639,314 A * | 6/1997 | Kura et al. | 136/244 |
| 2002/0117199 A1 * | 8/2002 | Oswald | 136/256 |
| 2010/0300507 A1 * | 12/2010 | Heng et al. | 136/244 |

* cited by examiner

*Primary Examiner* — Miriam Berdichevsky
(74) *Attorney, Agent, or Firm* — Birch, Stewart, Kolasch & Birch, LLP

(57) ABSTRACT

A thin film solar cell and a method of manufacturing the same are discussed. The method of manufacturing the thin film solar cell includes forming a masking jig in a first region of a substrate, forming a first electrode in a second region of the substrate, forming a photoelectric conversion unit on the first electrode formed in the second region of the substrate to produce electricity using light incident on the photoelectric conversion unit, and forming a second electrode on the photoelectric conversion unit formed in the second region of the substrate.

11 Claims, 9 Drawing Sheets

US 8,642,881 B2

THIN FILM SOLAR CELL AND METHOD OF MANUFACTURING THE SAME

This application claims priority to and the benefit of Korean Patent Application No. 10-2010-0109096 filed in the Korean Intellectual Property Office on Nov. 4, 2010, the entire contents of which are incorporated herein by reference.

BACKGROUND OF THE INVENTION

1. Field of the Invention

Embodiments of the invention relate to a thin film solar cell and a method of manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts that have different conductive types, such as a p-type and an n-type, and form a p-n junction, and electrodes respectively connected to the semiconductor parts of the different conductive types.

When light is incident on the solar cell, a plurality of electron-hole pairs are generated in the semiconductor parts. The electron-hole pairs are separated into electrons and holes by the photovoltaic effect. Thus, the separated electrons move to the n-type semiconductor part and the separated holes move to the p-type semiconductor part, and then the electrons and holes are collected by the electrodes electrically connected to the n-type semiconductor part and the p-type semiconductor part, respectively. The electrodes are connected to each other using electric wires to thereby obtain electric power.

SUMMARY OF THE INVENTION

In one aspect, there is a method of manufacturing a thin film solar cell including forming a masking jig in a first region of a substrate, forming a first electrode in a second region of the substrate, forming a photoelectric conversion unit on the first electrode formed in the second region of the substrate and configured to produce electricity using light incident on the photoelectric conversion unit, and forming a second electrode on the photoelectric conversion unit formed in the second region of the substrate.

The first region of the substrate may be positioned at an edge of the substrate.

A plurality of cells each including the first electrode, the photoelectric conversion unit, and the second electrode may be formed in the second region of the substrate. The plurality of cells may not be formed in the first region of the substrate.

A width of the first region may be about 3 mm to 30 mm. Alternatively, the width of the first region may be about 8 mm to 20 mm.

A lower width of a portion of the masking jig that overlaps and adjoins the substrate, may be less than an upper width of a portion of the masking jig that overlaps and does not adjoin the substrate.

A width of the first region may be less than the upper width of the portion of the masking jig that overlaps and does not adjoin the substrate, and may be greater than the lower width of the portion of the masking jig that overlaps and adjoins the substrate.

An edge isolation process or an edge deletion process, that removes the same portions of the first electrode, the photoelectric conversion unit, and the second electrode to expose a portion of the substrate, may be omitted in the method of manufacturing the thin film solar cell.

In another aspect, there is a thin film solar cell including a substrate including a first region and a second region, and a plurality of cells each including a first electrode positioned on the substrate, a second electrode positioned on the first electrode, and a photoelectric conversion unit that is positioned between the first electrode and the second electrode and configured to produce electricity using light incident on the photoelectric conversion unit, wherein the plurality of cells are not positioned in the first region of the substrate and are positioned in the second region of the substrate, and the plurality of cells do not include a dummy cell which does not contribute to generation of the electricity.

The first region of the substrate may be positioned at an edge of the substrate. A width of the first region may be about 3 mm to 30 mm. Alternatively, the width of the first region may be about 8 mm to 20 mm.

The photoelectric conversion unit may have at least one p-i-n structure including a p-type semiconductor layer, an intrinsic semiconductor layer, and an n-type semiconductor layer.

The intrinsic semiconductor layer of the photoelectric conversion unit may contain germanium (Ge). Alternatively, the intrinsic semiconductor layer of the photoelectric conversion unit may contain at least one of amorphous silicon and microcrystalline silicon.

In an outermost cell closest to the first region among the plurality of cells positioned in the second region, a thickness of at least one of the first electrode, the photoelectric conversion unit, and the second electrode may decrease over a distance in portions that are closer to the first region.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
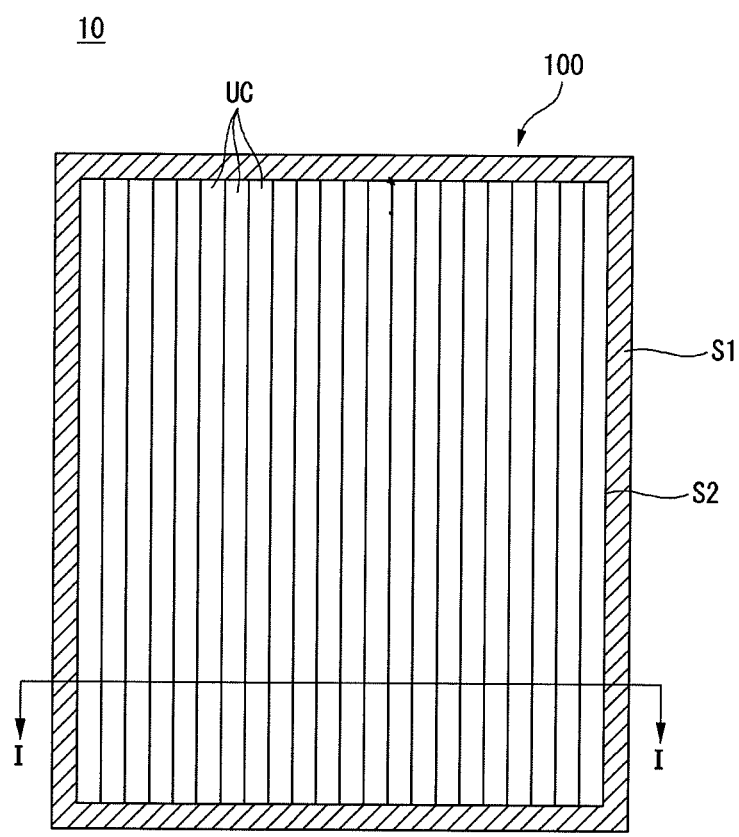
FIGS. 1 and 2 illustrate a thin film solar cell according to an example embodiment of the invention.

The invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 2:
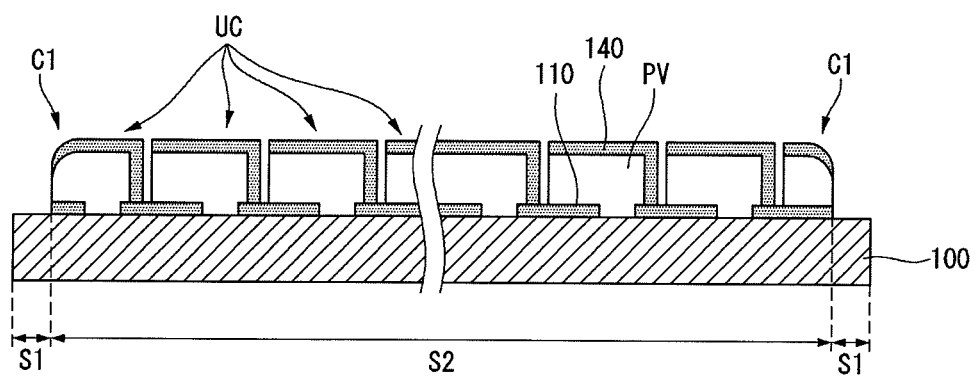

FIGS. 1 and 2 illustrate a thin film solar cell according to an example embodiment of the invention. More specifically, FIG. 1 is a plane view of a thin film solar cell, and FIG. 2 is a cross-sectional view taken along lines I-I of FIG. 1.

As shown in FIG. 1, a thin film solar cell 10 according to an example embodiment of the invention includes a substrate 100 and a plurality of cells UC positioned on the substrate 100.

As shown in FIG. 2, each of the plurality of cells UC includes a first electrode 110, a photoelectric conversion unit PV, and a second electrode 140. The first electrode 110 is positioned on the substrate 100, and the second electrode 140 is positioned on the first electrode 110. The photoelectric conversion unit PV is positioned between the first electrode 110 and the second electrode 140, and converts light incident on an incident surface of the substrate 100 into electricity.

The first electrode 110, the photoelectric conversion unit PV, and the second electrode 140 in various forms are described in detail below with reference to FIGS. 4 to 6.

As shown in FIGS. 1 and 2, the substrate 100 includes a first region S1 and a second region S2. The first region S1 is positioned at an edge, such as a peripheral edge, of the substrate 100, and the plurality of cells UC are not disposed in the first region S1. The second region S2 corresponds to a region that remains when the first region S1 is excluded from the substrate 100, and the plurality of cells UC are disposed in the second region S2. The plurality of cells UC disposed in the second region S2 do not include dummy cells, which do not affect (or contribute to) the generation of electric power.

The plurality of cells UC disposed in the second region S2 include cells affecting (or contributing to) the generation of electric power. Since the dummy cells, which do not affect (or contribute to) the generation of electric power, are not disposed in the second region S2, the second region S2 may be referred to as an effective region. Since the plurality of cells UC affecting (or contributing to) the generation of electric power are not disposed in the first region S1, the first region S1 may be referred to as an ineffective region.

In other words, in the thin film solar cell 10 according to the embodiment of the invention, the plurality of cells UC are not disposed in the first region S1. Further, the plurality of cells UC affecting (or contributing to) the generation of electric power are disposed in the second region S2, and the dummy cells, which do not affect (or contribute to) the generation of the electric power, are not disposed in the second region S2. Therefore, it is possible to increase the number of cells UC affecting (or contributing to) the generation of electric power in the effective region.

As shown in FIG. 2, in an outermost cell C1 closest to the first region S1 among the plurality of cells UC disposed in the second region S2, there is a decrease in thickness over a distance in portions that are closer to the first region S1, so that a thickness of at least one of the first electrode 110, the photoelectric conversion unit PV, and the second electrode 140 of the outermost cell C1 may decrease. This is because of characteristics of a method of manufacturing the thin film solar cell 10 according to the embodiment of the invention. This is described in detail below with reference to FIGS. 7 to 14. Additionally, in embodiments of the invention, a respective portion of the at least one of the first electrode 110, the photoelectric conversion unit PV, and the second electrode 140 of the outermost cell C1, that is closest to the first region S1 may be inclined with respect to a top surface of the substrate 100. This is also described in detail below with reference to FIGS. 7 to 14.

The reduction or decrease in the thickness illustrated in FIG. 2 is described below as compared to a related art solar cell shown in FIG. 3.

Figure 3:
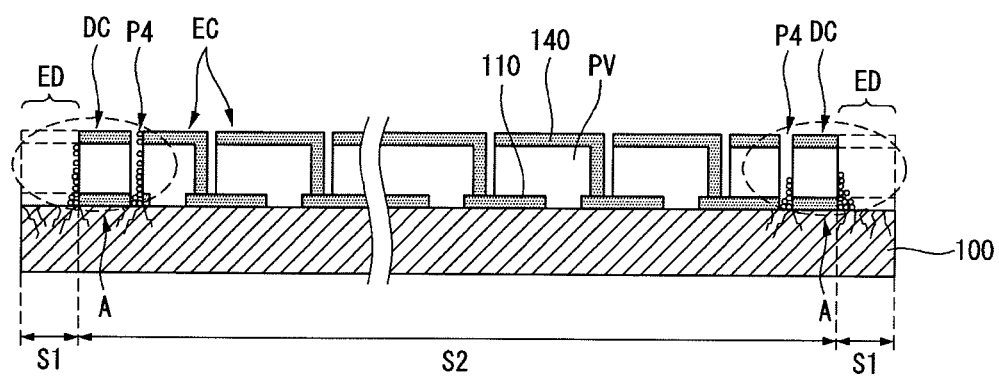
FIG. 3 illustrates a thin film solar cell according to a related art solar cell.

As shown in FIG. 3, the related art solar cell is generally formed by forming a first electrode 110, a photoelectric conversion unit PV, and a second electrode 140 on the entire surface of a substrate 100, and then perform an edge isolation process for removing the same portions P4 of the first electrode 110, the photoelectric conversion unit PV, and the second electrode 140 using a laser in a final process to expose a portion of the substrate 100. After the edge isolation process is performed, an edge deletion process for removing partial edges ED of the first electrode 110, the photoelectric conversion unit PV, and the second electrode 140 in an outer direction of the portion P4 formed during the edge isolation process is performed using a sandblast method or a laser.

In the related art solar cell thus formed, a plurality of cells are formed in not a first region S1 but a second region S2. The plurality of cells formed in the second region S2 include dummy cells DC, which do not affect (or contribute to) the generation of the electric power, as well as effective cells EC affecting (or contributing to) the generation of electric power.

The first electrode 110, the photoelectric conversion unit PV, and the second electrode 140 are formally formed in the dummy cells DC. However, because the dummy cells DC are substantially isolated from the effective cells EC by the portion P4 formed during the edge isolation process, the dummy cells DC do not affect (or contribute to) the generation of the electric power of the solar cell.

As discussed above, in the related art solar cell of FIG. 3, because the dummy cells DC exist in the second region S2, the number of effective cells EC formed in the second region S2 decreases. Hence, photoelectric efficiency of the solar cell per a unit area is reduced.

On the other hand, in the thin film solar cell according to the embodiment of the invention, because the dummy cells do not exist in all regions of the substrate 100, i.e. in both the first and second regions S1 and S2 (i.e., the ineffective region and the effective region), the photoelectric efficiency of the thin film solar cell may increase.

A width of the first region S1 of the substrate 100 may be about 3 mm to 30 mm in an embodiment of the invention.

After the solar cell shown in FIG. 2 is formed, a solar cell module may be surrounded by a predetermined material, for example, ethylene vinyl acetate (EVA). A frame may be formed on the side of the solar cell module surrounded by the EVA. The frame overlaps the incident surface of the substrate 100 by the width of the first region S1. In other words, the frame and the substrate 100 may overlap each other by the width of the first region S1, and thus light corresponding to the width of the first region S1 incident on the incident surface of the substrate 100 may be shielded.

Accordingly, when the width of the first region S1 corresponding to the overlap portion between the frame and the substrate 100 is equal to or greater than 3 mm, the substrate 100 may be stably supported by the frame.

Further, when the size of the overlap portion between the frame and the substrate 100 is excessively large, the efficiency of the solar cell module may be reduced. Therefore, when the width of the first region S1 is equal to or less than 30 mm, a large amount of light may be incident on the incident surface of the substrate 100. Further, the size of the second region S2 in which the effective cells are formed may be sufficiently secured, and the efficiency of the solar cell module may be improved.

The width of the first region S1 of the substrate 100 may be set to about 8 mm to 20 mm in consideration of the efficiency and the stability of the solar cell module.

Figure 4:
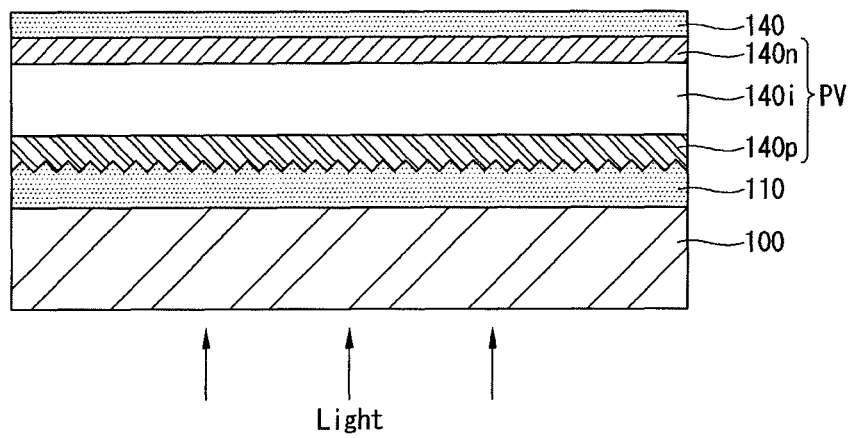
FIGS. 4 to 6 specifically illustrate various cells that may be included in a thin film solar cell according to example embodiments of the invention.
Figure 5:
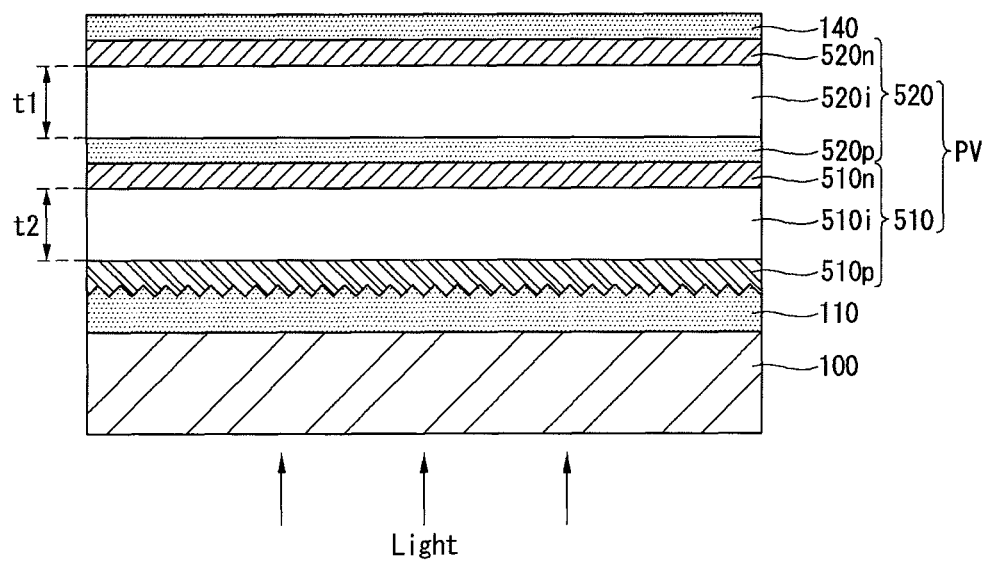
Figure 6:
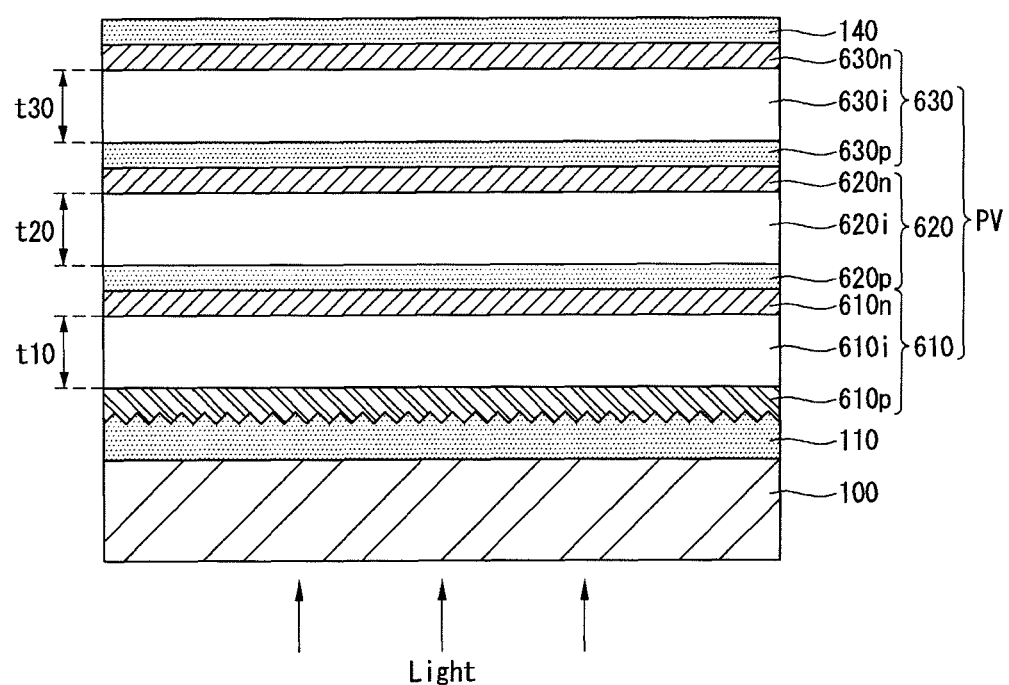

FIGS. 4 to 6 illustrate various cells that may be included in the thin film solar cell shown in FIG. 1.

As shown in FIG. 4, the thin film solar cell 10 may have a p-i-n structure in embodiments of the invention.

FIG. 4 illustrates the photoelectric conversion unit PV having the p-i-n structure based on the incident surface of the substrate 100. Additionally, the photoelectric conversion unit PV may have an n-i-p structure based on the incident surface of the substrate 100. In the following description, the photoelectric conversion unit PV having the p-i-n structure based on the incident surface of the substrate 100 is taken as an example for the sake of brevity.

As shown in FIG. 4, the thin film solar cell 10 may includes the substrate 100, the first electrode 110 positioned on the substrate 100, the second electrode 140, and the photoelectric conversion unit PV having the p-i-n structure.

The substrate 100 may provide a space for other functional layers. The substrate 100 may be formed of a substantially transparent material, for example, glass or plastic, so that light incident on the substrate 100 efficiently reaches the photoelectric conversion unit PV.

The first electrode 110 positioned on the substrate 100 may contain a substantially transparent material with electrical conductivity so as to increase a transmittance of incident light. More specifically, the first electrode 110 may be formed of a material having high light transmittance and high electrical conductivity, so as to transmit most of incident light and pass through electric current. For example, the first electrode 110 may be formed of at least one selected from the group consisting of indium tin oxide (ITO), tin-based oxide (for example, $SnO_2$), AgO, ZnO—$Ga_2O_3$ (or ZnO—$Al_2O_3$), fluorine tin oxide (FTO), and a combination thereof. A specific resistance of the first electrode 110 may be about $10^{-2}$ Ω·cm to $10^{-11}$ Ω·cm.

The first electrode 110 may be electrically connected to the photoelectric conversion unit PV. Hence, the first electrode 110 may collect carriers (for example, holes) produced by the incident light and may output the carriers.

A plurality of uneven portions may be formed on an upper surface of the first electrode 110, and the uneven portions may have a non-uniform pyramid structure. In other words, the first electrode 110 may have a textured surface. As discussed above, when the surface of the first electrode 110 is textured, the first electrode 110 may reduce a reflectance of incident light and increase an absorptance of light. Hence, the efficiency of the solar cell 10 may be improved.

Although FIG. 1 shows only the uneven portions of the first electrode 110, the photoelectric conversion unit PV may have a plurality of uneven portions. In the embodiment of the invention, for example, only the uneven portions of the first electrode 110 is described below for the sake of brevity.

The second electrode 140 may be formed of metal with high electrical conductivity so as to increase a recovery efficiency of electric power produced by the photoelectric conversion unit PV. The second electrode 140 electrically connected to the photoelectric conversion unit PV may collect carriers (for example, electrons) produced by incident light and may output the carriers.

The photoelectric conversion unit PV is positioned between the first electrode 110 and the second electrode 140 and produces the electric power using light coming from the outside.

The photoelectric conversion unit PV may have the p-i-n structure including a p-type semiconductor layer 140p, an intrinsic (called i-type) semiconductor layer 140i, and an n-type semiconductor layer 140n that are sequentially formed on the incident surface of the substrate 100 in the order named. Other layers may be included or present in the photoelectric conversion unit PV.

The p-type semiconductor layer 140p may be formed using a gas obtained by adding impurities of a group III element, such as boron (B), gallium (Ga), and indium (In), to a raw gas containing silicon (Si).

The i-type semiconductor layer 140i may prevent or reduce a recombination of carriers and may absorb light. The i-type semiconductor layer 140i may absorb incident light to produce carriers such as electrons and holes. The i-type semiconductor layer 140i may be a semiconductor of various kinds, and may be one containing microcrystalline silicon (mc-Si), for example, hydrogenated microcrystalline silicon (mc-Si:H). Additionally, the i-type semiconductor layer 140i may contain amorphous silicon (a-Si), for example, hydrogenated amorphous silicon (a-Si:H).

The n-type semiconductor layer 140n may be formed using a gas obtained by adding impurities of a group V element, such as phosphorus (P), arsenic (As), and antimony (Sb), to a raw gas containing silicon (Si).

The photoelectric conversion unit PV may be formed using a chemical vapor deposition (CVD) method, such as a plasma enhanced CVD (PECVD) method.

In the photoelectric conversion unit PV, the p-type semiconductor layer 140p and the n-type semiconductor layer 140n may form a p-n junction with the i-type semiconductor layer 140i interposed therebetween. In other words, the i-type semiconductor layer 140i may be positioned between the p-type semiconductor layer 140p (i.e., a p-type doped layer) and the n-type semiconductor layer 140n (i.e., an n-type doped layer).

In such a structure of the thin film solar cell 10, when light is incident on the p-type semiconductor layer 140p, a depletion region is formed inside the i-type semiconductor layer 140i because of the p-type semiconductor layer 140p and the n-type semiconductor layer 140n each having a relatively high doping concentration, thereby generating an electric field. Electrons and holes produced in the i-type semiconductor layer 140i corresponding to a light absorbing layer are separated from each other by a contact potential difference through a photovoltaic effect and move in different directions. For example, the holes may move to the first electrode 110 through the p-type semiconductor layer 140p, and the electrons may move to the second electrode 140 through the n-type semiconductor layer 140n. Hence, electric power may be produced.

Alternatively, as shown in FIG. 5, the thin film solar cell 10 according the embodiment of the invention may have a double junction structure or a p-i-n/p-i-n structure. In the following explanations, structural elements having the same functions and structures as those discussed previously are designated by the same reference numerals, and the explanations therefore will not be repeated unless they are necessary.

As shown in FIG. 5, the photoelectric conversion unit PV of the double junction thin film solar cell 10 may include a first photoelectric conversion unit 510 and a second photoelectric conversion unit 520. More specifically, a first p-type semiconductor layer 510p, a first i-type semiconductor layer 510i, a first n-type semiconductor layer 510n, a second p-type semiconductor layer 520p, a second i-type semiconductor layer 520i, and a second n-type semiconductor layer 520n may be sequentially stacked on the incident surface of the substrate 100 in the order named. Other layers may be included or present in the first and/or second photoelectric conversion units or therebetween.

The first i-type semiconductor layer 510i may mainly absorb light of a short wavelength band to produce electrons and holes. The second i-type semiconductor layer 520i may mainly absorb light of a long wavelength band to produce electrons and holes.

As discussed above, because the double junction thin solar cell 10 absorbs light of the short wavelength band and light of the long wavelength band to produce carriers, the efficiency of the double junction thin film solar cell 10 can be improved.

A thickness t1 of the second i-type semiconductor layer 520i may be greater than a thickness t2 of the first i-type semiconductor layer 510i, so as to sufficiently absorb light of the long wavelength band.

The first i-type semiconductor layer 510i of the first photoelectric conversion unit 510 and the second i-type semiconductor layer 520i of the second photoelectric conversion unit 520 may contain amorphous silicon. Alternatively, the first i-type semiconductor layer 510i of the first photoelectric conversion unit 510 may contain amorphous silicon, and the second i-type semiconductor layer 520i of the second photoelectric conversion unit 520 may contain microcrystalline silicon.

In the double junction thin film solar cell 10 shown in FIG. 5, the second i-type semiconductor layer 520i of the second photoelectric conversion unit 520 may be doped with germanium (Ge) as impurities. Because germanium (Ge) may reduce a band gap of the second i-type semiconductor layer 520i, an absorptance of the second i-type semiconductor layer 520i with respect to light of the long wavelength band may increase. Hence, the efficiency of the double junction thin film solar cell 10 may be improved.

In other words, in the double junction thin film solar cell 10, the first i-type semiconductor layer 510i may absorb light of the short wavelength band to provide the photoelectric effect, and the second i-type semiconductor layer 520i may absorb light of the long wavelength band to provide the photoelectric effect. Further, because the band gap of the second i-type semiconductor layer 520i doped with Ge may be reduced, the second i-type semiconductor layer 520i may absorb a large amount of light of the long wavelength band. As a result, the efficiency of the thin film solar cell 10 may be improved.

The PECVD method may be used to dope the second i-type semiconductor layer 520i with Ge. In the PECVD method, a very high frequency (VHF), a high frequency (HF), or a radio frequency (RF) may be applied to a chamber filled with Ge gas.

In the embodiment of the invention, an amount of Ge contained in the second i-type semiconductor layer 520i may be about 3 to 20 atom %. When the amount of Ge is within the above range, the band gap of the second i-type semiconductor layer 520i may be sufficiently reduced. Hence, an absorptance of the second i-type semiconductor layer 520i with respect to light of the long wavelength band may increase.

Even in this instance, the first i-type semiconductor layer 510i may mainly absorb light of the short wavelength band to produce electrons and holes. The second i-type semiconductor layer 520i may mainly absorb light of the long wavelength band to produce electrons and holes.

Alternatively, as shown in FIG. 6, the thin film solar cell 10 according to the embodiment of the invention may have a triple junction structure or a p-i-n/p-i-n/p-i-n structure. In the following explanations, structural elements having the same functions and structures as those discussed previously are designated by the same reference numerals, and the explanations therefore will not be repeated unless they are necessary.

As shown in FIG. 6, the photoelectric conversion unit PV of the triple junction thin film solar cell 10 may include a first photoelectric conversion unit 610, a second photoelectric conversion unit 620, and a third photoelectric conversion unit 630 that are sequentially positioned on the light incident surface of the substrate 100 in the order named. Other layers may be included or present in the first, second and/or third photoelectric conversion units or therebetween.

Each of the first photoelectric conversion unit 610, the second photoelectric conversion unit 620, and the third photoelectric conversion unit 630 may have the p-i-n structure. A first p-type semiconductor layer 610p, a first i-type semiconductor layer 610i, a first n-type semiconductor layer 610n, a second p-type semiconductor layer 620p, a second i-type semiconductor layer 620i, a second n-type semiconductor layer 620n, a third p-type semiconductor layer 630p, a third i-type semiconductor layer 630i, and a third n-type semiconductor layer 630n may be sequentially positioned on the substrate 100 in the order named. Other layers may be included or present in the first, second, and/or third photoelectric conversion units or therebetween.

The first i-type semiconductor layer 610i, the second i-type semiconductor layer 620i, and the third i-type semiconductor layer 630i may be variously implemented.

As a first example, the first i-type semiconductor layer 610i and the second i-type semiconductor layer 620i may contain amorphous silicon (a-Si), and the third i-type semiconductor layer 630i may contain microcrystalline silicon (mc-Si). A band gap of the second i-type semiconductor layer 620i may be reduced by doping the second i-type semiconductor layer 620i with Ge.

Alternatively, as a second example, the first i-type semiconductor layer 610i may contain amorphous silicon (a-Si), and the second i-type semiconductor layer 620i and the third i-type semiconductor layer 630i may contain microcrystalline silicon (mc-Si). A band gap of the third i-type semiconductor layer 630i may be reduced by doping the third i-type semiconductor layer 630i with Ge.

The first photoelectric conversion unit 610 may absorb light of a short wavelength band, thereby producing electric power. The second photoelectric conversion unit 620 may absorb light of a middle wavelength band between the short wavelength band and a long wavelength band, thereby producing electric power. The third photoelectric conversion unit 630 may absorb light of the long wavelength band, thereby producing electric power.

A thickness t30 of the third i-type semiconductor layer 630i may be greater than a thickness t20 of the second i-type semiconductor layer 620i, and the thickness t20 of the second i-type semiconductor layer 620i may be greater than a thickness t10 of the first i-type semiconductor layer 610i.

Because the triple junction thin film solar cell 10 shown in FIG. 6 may absorb light of a wider band, the production efficiency of the electric power of the triple junction thin film solar cell 10 may be improved.

FIGS. 7 to 14 relate to a method of manufacturing a thin film solar cell according to example embodiments of the invention.

Figure 7:
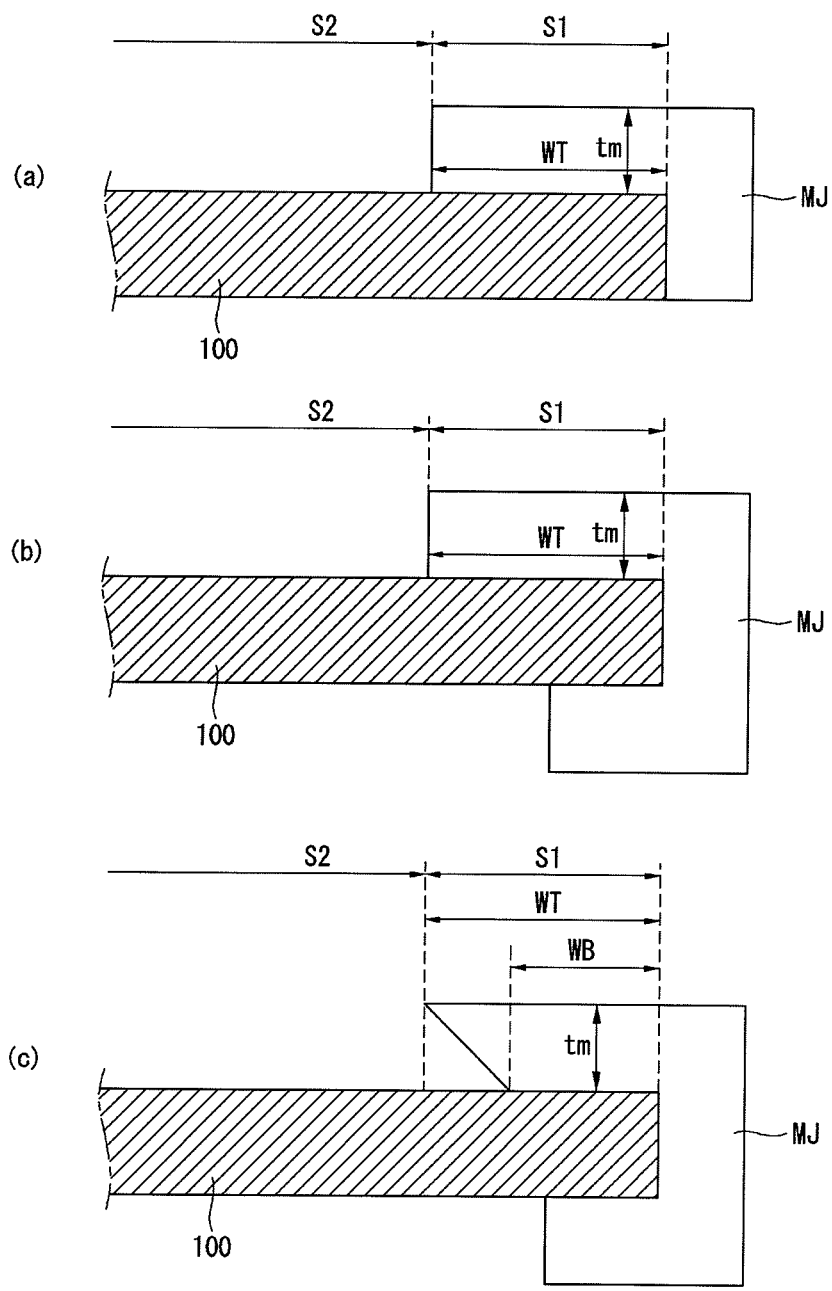
FIGS. 7 to 14 relate to a method of manufacturing a thin film solar cell according to example embodiments of the invention.

As shown in FIG. 7, first, a masking jig MJ is formed in the first region S1 of the substrate 100.

More specifically, as shown in (a) of FIG. 7, the masking jig MJ may be formed to cover a portion of the upper surface and/or the side surface of the substrate 100. Alternatively, as shown in (b) of FIG. 7, the masking jig MJ may be formed to cover a portion of the upper surface, the side surface, and/or a portion of the lower surface of the substrate 100. The portion of the upper surface covered by the masking jig MJ corresponds to the first region S1 of the substrate 100, and a portion of the upper surface not covered by the masking jig MJ corresponds to the second region S2 of the substrate 100. In embodiments of the invention, the masking jig MJ may simply be placed on the substrate 100, and may also be further attached via a mechanical device or by an adhesive, for example.

Thus, the plurality of cells UC are formed in the second region S2 and are not formed in the first region S1. This is described in detail below with reference to FIG. 8.

Figure 13:
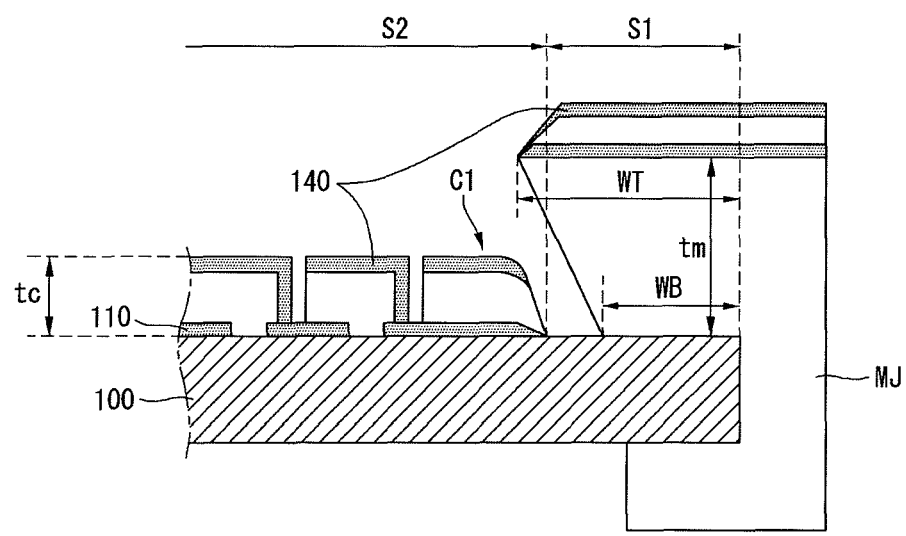

As shown in FIG. 13, a thickness tm of the masking jig MJ formed in the first region S1 of the substrate 100 may be set to about 5 to 100 times a thickness tc of a cell including the first electrode 110, the photoelectric conversion unit PV, and the second electrode 140 that will be formed in a subsequent process.

When the thickness tm of the masking jig MJ is equal to or great than about 5 times the thickness tc of the cell, the first electrode 110, the photoelectric conversion unit PV, or the second electrode 140 is prevented from being more thickly formed on the side of the masking jig MJ Further, when the thickness tm of the masking jig MJ is greater than about 100 times the thickness tc of the cell (i.e., when the thickness tm of the masking jig MJ excessively increases), elasticity of the masking jig MJ is excessively reduced. Hence, excessive force may be transferred to the substrate 100 by a slight error during the control of the masking jig MJ, thereby resulting in damage to the substrate 100. Therefore, it is preferable, but not required, the thickness tm of the masking jig MJ is equal to or less than about 100 times the thickness tc of the cell.

As shown in (a) and (b) of FIG. 7, an upper width and a lower width of a portion of the masking jig MJ overlapping the substrate 100 are substantially equal to each other. In this instance, a width of the portion of the masking jig MJ overlapping the substrate 100 may be substantially equal to a width of the first region S1.

Alternatively, as shown in (c) of FIG. 7, a lower width of a portion of the masking jig MJ adjoining the substrate 100 may be less than an upper width of a portion of the masking jig MJ not adjoining the substrate 100. Accordingly, an overhanging portion is formed in the jig MJ.

More specifically, as shown in (c) FIG. 7, the masking jig MJ is formed to cover a portion of the upper surface, the side surface, and a portion of the lower surface of the substrate 100. In this instance, a lower width WB of an overlap portion (or the overhanging portion) of the masking jig MJ adjoining the substrate 100 may be less than an upper width WT of the overlap portion of the masking jig MJ not adjoining the substrate 100.

Further, as shown in FIG. 13, the width of the first region S1 may be less than an upper width WT of the overlap portion of the masking jig MJ overlapping the substrate 100 and may be greater than a lower width WB of an overlap portion of the masking jig MJ adjoining the substrate 100. In this embodiment of the invention, the overlapping (or overhanging portion) may have a width of WT-WB. In the overlapping portion, a surface that is inclined with respect to the top surface of the substrate 100 may be present. The inclined surface of the overlapping portion may be straight, curved, or irregular.

Figure 14:
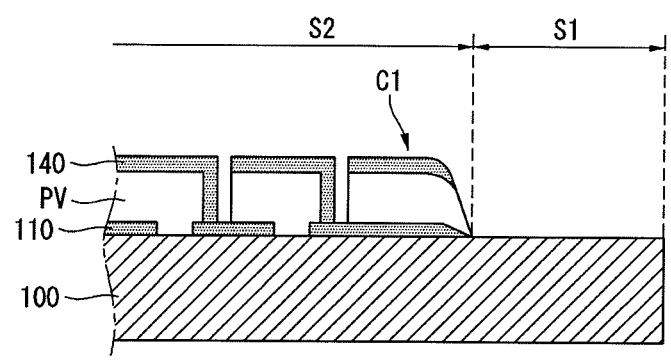

As discussed above, when the upper width WT of the overlap portion of the masking jig MJ overlapping the substrate 100 is greater than the lower width WB of the overlap portion of the masking jig MJ adjoining the substrate 100, the first electrode 110, the photoelectric conversion unit PV, or the second electrode 140 formed in the second region S2 of the substrate 100 may be prevented from being more thickly formed on the side of the masking jig MJ. Further, as shown in FIGS. 13 and 14, in an outermost cell C1 closest to the first region S1 among the plurality of cells UC formed in the second region S2, there is a decrease in a thickness over a distance in portions that are closer to the first region S1 in a state where the upper width WT of the masking jig MJ is greater than the lower width WB of the masking jig MJ, so that a thickness of at least one of the first electrode 110, the photoelectric conversion unit PV, and the second electrode 140 may decrease. In embodiments of the invention, at least one of the first electrode 110, the photoelectric conversion unit PV, and the second electrode 140 of the outermost cell C1, may have a portion that is closest to the first region S1 be inclined with respect to a top surface of the substrate 100. The surface of the inclined portion of the first electrode 110, the photoelectric conversion unit PV, and/or the second electrode 140 may be straight, curved or irregular. Additionally, an amount of the incline for the respective first electrode 110, the photoelectric conversion unit PV, and the second electrode 140 need not be the same, and may be different from each other.

This is because when the sputtering method or the chemical vapor deposition (CVD) method is used to form the first electrode 110, the photoelectric conversion unit PV, and the second electrode 140 in a state where the upper width WT of the masking jig MJ is greater than the lower width WB of the masking jig MJ, materials of the first electrode 110, the photoelectric conversion unit PV, and the second electrode 140 are not deposited directly vertically based on an upper end of the masking jig MJ being an overhang, and are instead deposited in a jet or fan form.

Further, the thickness of the masking jig MJ shown in (c) of FIG. 7 may be implemented as in (a) and (b) of FIG. 7.

The masking jig MJ may be formed to be removable, whereby methods for detaching from or attaching to the first region S1 of the substrate 100 may be implemented.

Alternatively, the first electrode 110, the photoelectric conversion unit PV, and the second electrode 140 may be formed using individual masking jigs each having a different upper width.

The masking jig MJ is one component of a device for manufacturing the solar cell. Thus, the masking jig MJ may be formed in a method for detaching from the first region S1 of the substrate 100 and may be independently used as a separate device.

Figure 8:
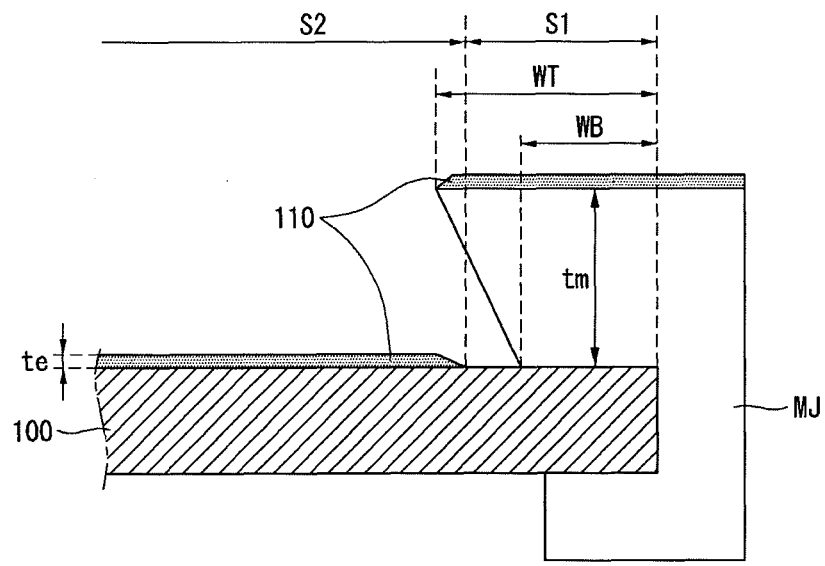

Next, as shown in FIG. 8, after the masking jig MJ is formed in the first region S1 of the substrate 100, the first electrode 110 may be formed in the second region S2 of the substrate 100 and on the masking jig MJ.

The first electrode 110 may be formed on the substrate 100 in the second region S2 using a sputter. The first electrode 110 is formed in only the second region S2 of the substrate 100. The material forming the first electrode 110 is formed on the upper surface of the masking jig MJ overlapping the first region S1 of the substrate 100, and thus is not formed in the first region S1 of the substrate 100.

Figure 9:
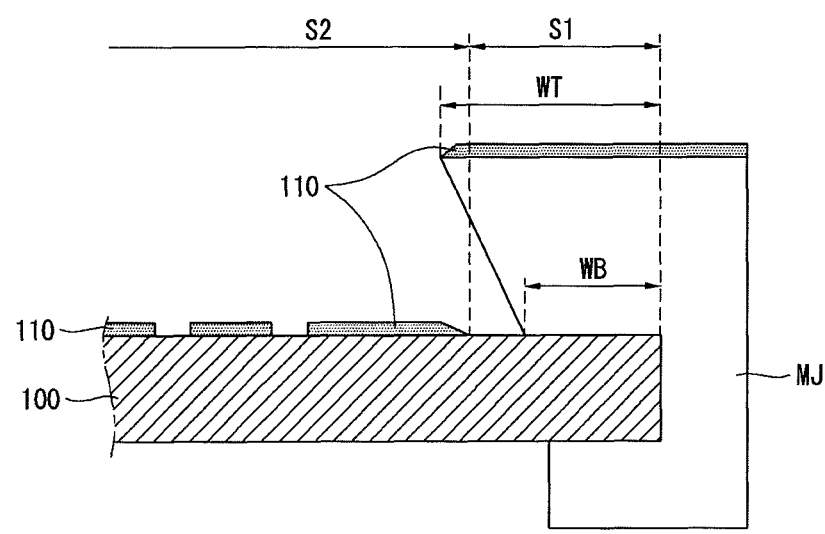

Next, as shown in FIG. 9, after the first electrode 110 is formed in the second region S2 of the substrate 100 and a material forming the first electrode 110 is formed on the masking jig MJ, a portion of the first electrode 110 may be etched. For example, a laser beam may be applied to the first electrode 110 based on a predetermined pattern, thereby removing the portion of the first electrode 110. Hence, a portion of the substrate 100 may be exposed to the first electrode 110.

Figure 10:
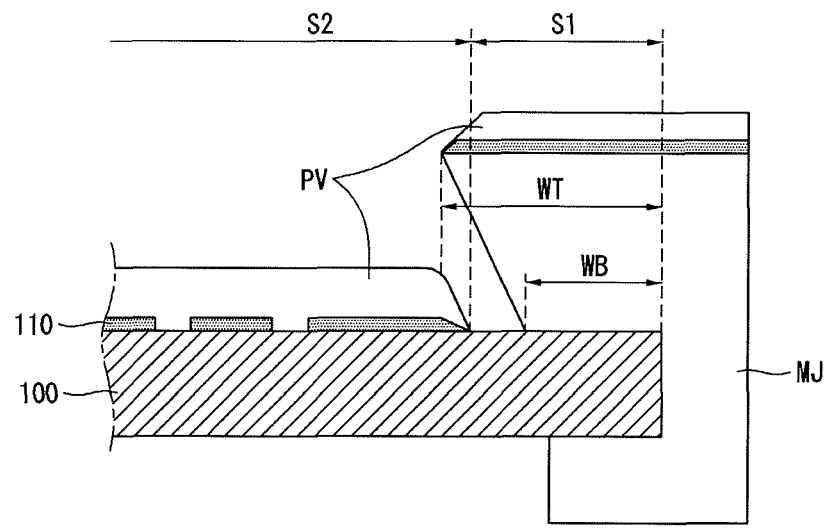

Next, as shown in FIG. 10, the photoelectric conversion unit PV may be formed on a patterned portion of the first electrode 110. The photoelectric conversion unit PV may be formed using a method for sequentially depositing a p-i-n semiconductor material, for example, using a chemical vapor deposition (CVD) method, such as a plasma enhanced CVD (PECVD) method.

The photoelectric conversion unit PV may be formed on the first electrode 110 in the second region S2 and on the first electrode 110 formed on the masking jig MJ because of the use of the CVD method. However, the photoelectric conversion unit PV is not formed in the first region S1 of the substrate 100 because of the masking jig MJ. The photoelectric conversion unit PV may be formed using a method for sequentially depositing a p-i-n semiconductor material.

Figure 11:
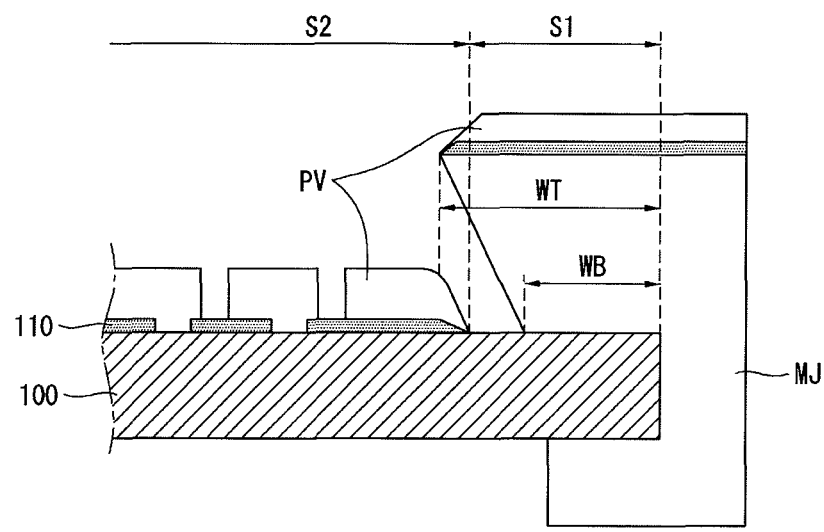

Next, as shown in FIG. 11, a portion of the photoelectric conversion unit PV in the second region S2 may be etched based on a predetermined pattern. Hence, a portion of the first electrode 110 may be exposed to the photoelectric conversion unit PV in the second region S2.

Figure 12:
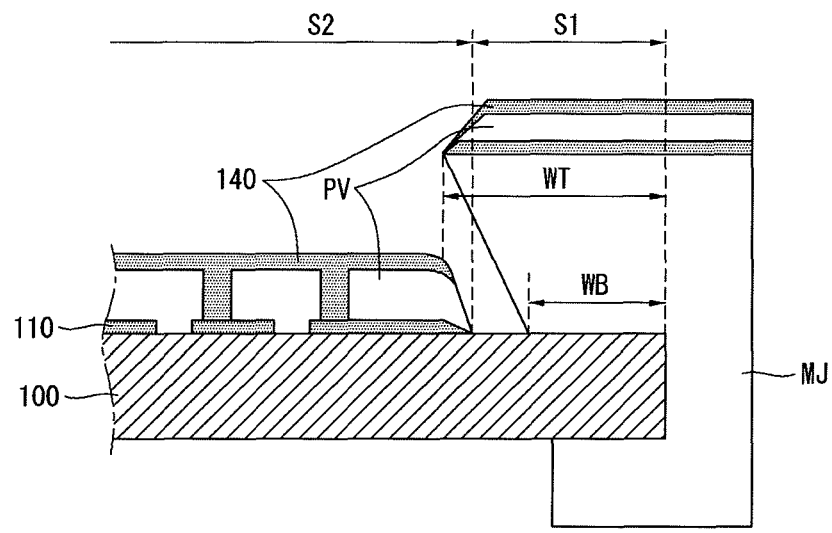

Next, as shown in FIG. 12, the second electrode 140 may be formed on the photoelectric conversion unit PV. More specifically, the second electrode 140 may be formed on the photoelectric conversion unit PV in the second region S2 and on the photoelectric conversion unit PV formed on the masking jig MJ. On the other hand, the second electrode 140 is not formed in the first region S1 of the substrate 100 because of the masking jig MJ. The second electrode 140 may be formed using a sputter.

Next, a portion of the second electrode 140 in the second region S2 and a portion of the photoelectric conversion unit PV may be etched based on a predetermined pattern using a laser beam. Hence, as shown in FIG. 13, a portion of the first electrode 110 may be exposed to the second electrode 140.

Next, as shown in FIG. 14, the masking jig MJ is removed. Hence, as shown in FIG. 2, only the effective cells EC, which affect (or contribute to) the generation of electric power and not the dummy cell DC, are disposed in the second region S2 and are not disposed in the first region S1.

The above-described method of manufacturing the thin film solar cell according to the embodiment of the invention does not include the edge isolation process or the edge deletion process, unlike the related art method of manufacturing the solar cell illustrated in FIG. 3.

In other words, the edge isolation process or the edge deletion process in the related art is the process capable of generating a remainder or residuals as indicated by a portion "A" of FIG. 3. An additional cleansing process is necessary so as to remove the remainder or residuals. As a result, the number of process for manufacturing the thin film solar cell increases, and thus process time thereof increases.

Further, the sandblast method used for the edge deletion process is the method for physically grinding the cell, so as to secure the insulation characteristic of the dummy cell DC. When the sandblast method is performed, microcracks may be generated in the substrate 100 as indicated by the portion "A" of FIG. 3. Hence, it is difficult to achieve the thin profile of the thin film solar cell 10.

On the other hand, because the method of manufacturing the thin film solar cell according to the embodiment of the invention does not include the edge isolation process or the edge deletion process, the additional cleansing process for removing the remainder or residuals generated during the edge isolation process or the edge deletion process is not necessary. Hence, process time of the thin film solar cell may be reduced.

Further, when the edge isolation process or the edge deletion process is performed in the related art, the microcracks may be generated in the substrate 100. However, because the method of manufacturing the thin film solar cell according to the embodiment of the invention does not include the edge isolation process or the edge deletion process, the problem of microcracks may be solved.

Furthermore, because the method of manufacturing the thin film solar cell according to the embodiment of the invention does not include the edge isolation process or the edge deletion process, the dummy cell generated during the edge isolation process or the edge deletion process may be omitted. Hence, the size of the effective region in the substrate 100 may further increase. As a result, the efficiency of the thin film solar cell may be improved.

In various embodiments of the invention, the one or more photoelectric conversion units of the thin film solar cell may be formed of any semiconductor material. Accordingly, materials for the one or more photoelectric conversion units may include Cadmium telluride (CdTe), Copper indium gallium selenide (CIGS) and/or other materials, including other thin film solar cell materials.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a thin film solar cell, the method comprising:
    forming a masking jig directly on a first region of a substrate;
    forming a first electrode directly on a second region of the substrate and on the masking jig in a state where the masking jig is formed on the first region of the substrate;
    forming a photoelectric conversion unit directly on the first electrode formed in the second region of the substrate and on the masking jig in the state where the masking jig is formed on the first region of the substrate;
    forming a second electrode on the photoelectric conversion unit formed in the second region of the substrate and on the masking jig in the state where the masking jig is formed on the first region of the substrate, and
    removing the masking jig from the substrate,
    wherein a thickness of the masking jig formed on the first region of the substrate is set to 5 to 100 times a thickness of a cell including the first electrode, the photoelectric conversion unit, and the second electrode formed on the second region of the substrate so that each layer of the first electrode, the photoelectric conversion unit and the second electrode formed on the second region of the substrate is spaced apart from each layer of the first electrode, the photoelectric conversion unit and the second electrode formed on the masking jig.

2. The method of claim 1, wherein the first region of the substrate is positioned at an edge of the substrate.

3. The method of claim 1, wherein a plurality of cells each including the first electrode, the photoelectric conversion unit, and the second electrode are formed in the second region of the substrate, and the plurality of cells are not formed in the first region of the substrate.

4. The method of claim 1, wherein a width of the first region is about 3 mm to 30 mm.

5. The method of claim 1, wherein a width of the first region is about 8 mm to 20 mm.

6. The method of claim 1, wherein a lower width of a portion of the masking jig that overlaps and adjoins the substrate is less than an upper width of a portion of the masking jig that overlaps and does not adjoin the substrate.

7. The method of claim 6, wherein a width of the first region is less than the upper width of the portion of the masking jig that overlaps and does not adjoin the substrate, and is greater than the lower width of the portion of the masking jig that overlaps and adjoins the substrate.

8. The method of claim 1, wherein one of an edge isolation process and an edge deletion process that removes the same portions of the first electrode, the photoelectric conversion unit, and the second electrode to expose a portion of the substrate, is omitted in the method of manufacturing the thin film solar cell.

9. The method of claim 1, wherein at least one of the first electrode, the photoelectric conversion unit and the second electrode has a surface that is inclined with respect to the substrate.

10. The method of claim 9, wherein each of the first electrode, the photoelectric conversion unit and the second electrode has an inclined surface, and an amount of incline of each inclined surface is different from one another.

11. A method of manufacturing a thin film solar cell, the method comprising:

forming a masking jig directly on a first region of a substrate;

forming a first electrode directly on a second region of the substrate and on the masking jig in a state where the masking jig is formed on the first region of the substrate;

forming a photoelectric conversion unit directly on the first electrode formed in the second region of the substrate and on the masking jig in the state where the masking jig is formed on the first region of the substrate;

forming a second electrode on the photoelectric conversion unit formed in the second region of the substrate and on the masking jig in the state where the masking jig is formed on the first region of the substrate; and removing the masking jig from the substrate, wherein a thickness of the masking jig formed on the first region of the substrate is set to 5 to 100 times a thickness of a cell including the first electrode, the photoelectric conversion unit, and the second electrode formed on the second region of the substrate.

* * * * *